United States Patent
Kim et al.

(10) Patent No.: US 8,144,520 B2
(45) Date of Patent: Mar. 27, 2012

(54) NON-VOLATILE MEMORY DEVICE AND METHOD OF READING DATA IN A NON-VOLATILE MEMORY DEVICE

(75) Inventors: Jae-Ho Kim, Seoul (KR); Hyun-Sil Oh, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 216 days.

(21) Appl. No.: 12/765,011

(22) Filed: Apr. 22, 2010

(65) Prior Publication Data

US 2010/0315881 A1    Dec. 16, 2010

(30) Foreign Application Priority Data

Jun. 10, 2009  (KR) ........................ 10-2009-0051577

(51) Int. Cl.
*G11C 11/34* (2006.01)
(52) U.S. Cl. .............................. 365/185.23; 365/230.06
(58) Field of Classification Search ............. 365/185.23, 365/230.06
See application file for complete search history.

(56) References Cited

U.S. PATENT DOCUMENTS

| 7,518,923 B2 * | 4/2009 | Mokhlesi ................. 365/185.18 |
| 2008/0056008 A1 | 3/2008 | Aritome et al. |

FOREIGN PATENT DOCUMENTS

| JP | 62-204496 | 9/1987 |
| KR | 1020090005695 A | 1/2009 |
| KR | 1020090026117 A | 3/2009 |

* cited by examiner

*Primary Examiner* — Son Dinh
*Assistant Examiner* — Nam Nguyen
(74) *Attorney, Agent, or Firm* — Volentine & Whitt, PLLC

(57) ABSTRACT

A non-volatile memory device includes a row decoder and a memory cell array. The row decoder generates a read voltage, and first, second and third drive voltages. The memory cell array includes a selected word line receiving the read voltage, a first neighboring word line of the selected word line receiving the second word line drive voltage, a second neighboring word line of the selected word line receiving the third word line drive voltage, and a non-neighboring word line of the selected word line receiving the first word line drive voltage.

18 Claims, 7 Drawing Sheets

| SWL | NWLH | NWLL | WL |
|---|---|---|---|
| H | L | L | VR |
| L | L | L | V1 |
| L | L | H | V2 |
| L | H | L | V3 |

| SWL | NWLH | NWLL | USWL | WL |
|---|---|---|---|---|
| H | L | L | L | VR |
| L | L | L | H | V1 |
| L | L | H | L | V2 |
| L | H | L | L | V3 |

NON-VOLATILE MEMORY DEVICE AND METHOD OF READING DATA IN A NON-VOLATILE MEMORY DEVICE

CROSS-REFERENCE TO RELATED APPLICATION(S)

A claim of priority under 35 USC §119 is made to Korean Patent Application No. 2009-0051577, filed on Jun. 10, 2009, the entirety of which is incorporated herein by reference.

BACKGROUND

The inventive concepts described herein are generally related to a memory device, and more particularly to a non-volatile memory device and a method of reading data in a non-volatile memory device.

Semiconductor memory devices may be divided into volatile memory devices and non-volatile memory devices. Volatile memory devices store data in memory cells including bi-stable flip-flops or capacitors. Volatile memory devices lose data stored therein when power is turned off.

Non-volatile memory devices, such as flash memory devices, retain stored data even though power is turned off. Non-volatile memory devices are used to store data or program codes in a wide range of applications, such as in computers, mobile communication devices, etc. Since flash memory devices are capable of electrically erasing and writing data, flash memory devices are widely used in applications requiring continuous updates. For example, flash memory devices may be used as storage devices storing system program codes.

Among flash memory devices, NAND-type flash memory devices have a larger degree of integration than NOR-type flash memory devices. NAND-type flash memory devices include a memory cell array to store data, and the memory cell array of the NAND-type flash memory devices include a plurality of cell strings. As the degree of integration increases, capacitive coupling between word lines in NAND-type flash memory devices becomes serious, thereby causing abnormal operations of NAND-type flash memory devices.

SUMMARY

Exemplary embodiments of the inventive concept provide a non-volatile memory device capable of reducing effects of capacitive coupling between word lines in a read mode.

Exemplary embodiments of the inventive concept provide a method of reading data in a non-volatile memory device, which reduces effects of capacitive coupling between word lines in a read mode.

In example embodiments of the inventive concept, a non-volatile memory device includes a row decoder and a memory cell array. The row decoder generates in a read mode a read voltage, a first word line drive voltage, a second word line drive voltage that is equal to or smaller than the first word line drive voltage, and a third word line drive voltage that is larger than the first word line drive voltage. The memory cell array includes a selected word line that receives the read voltage in the read mode; a first neighboring word line of the selected word line that receives the second word line drive voltage in the read mode; a second neighboring word line of the selected word line that receives the third word line drive voltage in the read mode; and a non-neighboring word line which of the selected word line that receives the first word line drive voltage in the read mode.

In other example embodiments of the inventive concept, a method of reading a non-volatile memory device includes generating, in a read mode, read voltage, a first word line drive voltage, a second word line drive voltage that is equal to or smaller than the first word line drive voltage, and a third word line drive voltage that is larger than the first word line drive voltage. The read voltage is applied to a selected word line in the read mode, the second word line drive voltage is applied to a first neighboring word line of the selected word line in the read mode, the third word line drive voltage is applied to a second neighboring word line of the selected word line in the read mode, and the first word line drive voltage is applied to a non-neighboring word line of the selected word line in the read mode.

BRIEF DESCRIPTION OF THE DRAWINGS

The accompanying drawings are included to provide a further understanding of the embodiments of the inventive concept, and are incorporated in and constitute a part of this specification. The drawings illustrate examples of the embodiments of the inventive concept and, together with the description, serve to explain principles of the inventive concept, and wherein.

DETAILED DESCRIPTION OF THE EMBODIMENTS

Figure 1:
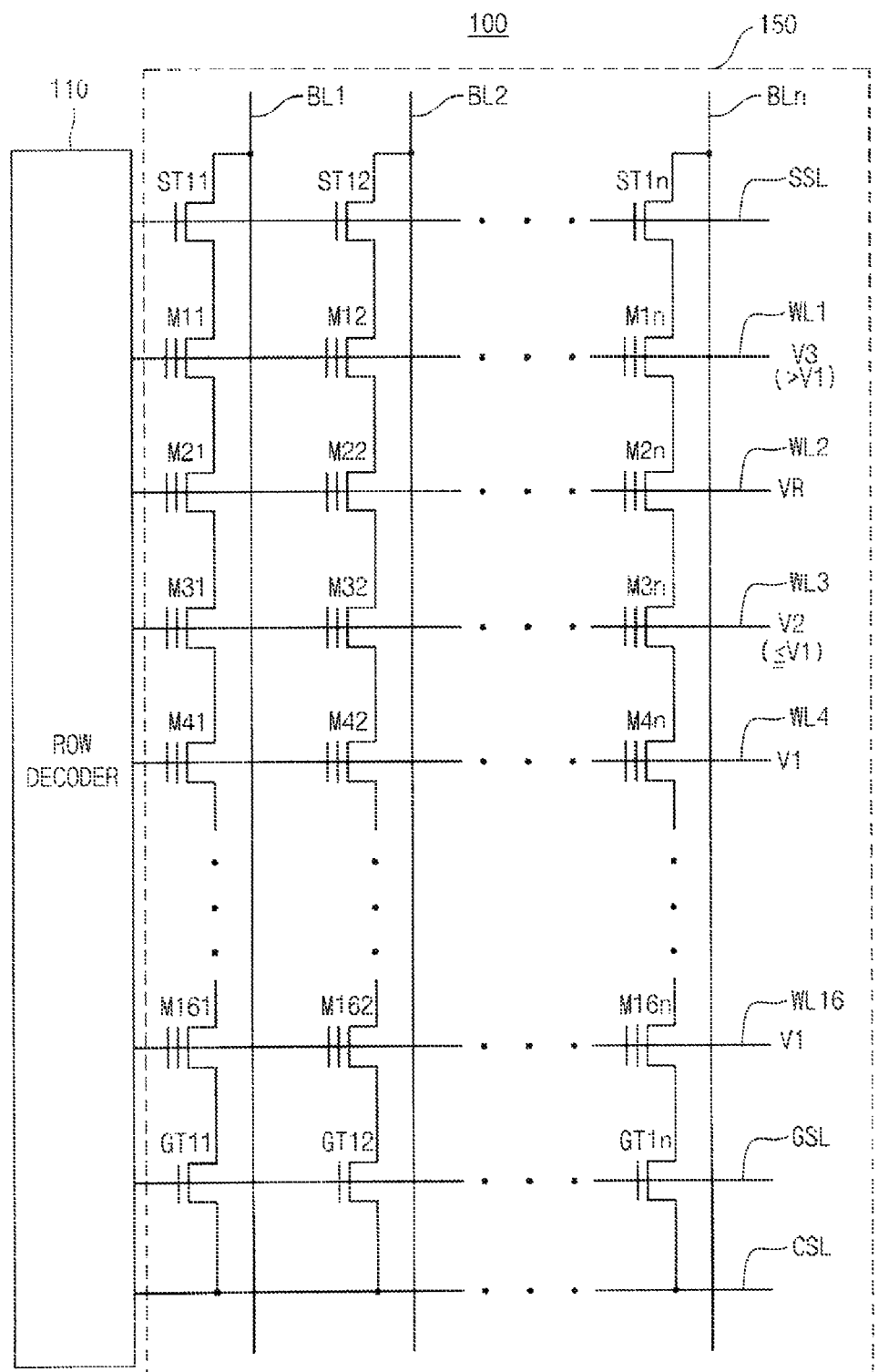
FIG. 1 is a circuit diagram illustrating a non-volatile memory device according to exemplary embodiments of the inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a non-volatile memory device according to exemplary embodiments of the inventive concept. Referring to FIG. 1, a non-volatile memory device 100 includes a row decoder 110 and a memory cell array 150. The memory cell array 150 of FIG. 1 represents a NAND-type flash memory cell array.

The row decoder 110 generates word line drive signals having voltage levels of a read voltage VR, a first word line drive voltage V1 that is larger than the read voltage VR, a second word line drive voltage V2 that is equal to or smaller than the first word line drive voltage V1, and a third word line drive voltage V3 that is larger than the first word line drive voltage V1.

A first string selection line SSL, a second string selection line GSL, word lines WL1 to WL16 and a common source line CSL are connected to and driven by the row decoder 110.

The memory cell array 150 includes selection transistors ST11 to ST1n and GT 11 to GT1n and memory transistors M11 to M16n. A selection transistor ST11, memory transistors M11, M21, M31, M41, M51, M61, M71, M81, M91, M101, M111, M121, M131, M141, M151 and M161, and a selection transistor GT11 is connected to a bit line BL1. A selection transistor ST12, memory transistors M12, M22, M32, M42, M52, M62, M72, M82, M92, M102, M112, M122, M132, M142, M152 and M162, and a selection transistor GT12 is connected to a bit line BL2. A selection transistor ST1n, memory transistors M1n, M2n, M3n, M4n, M5n, M6n, M7n, M8n, M9n, M10n, M11n, M12n, M13n, M14n, M15n and M16n, and a selection transistor GT1n is connected to a bit line BLn. A ground voltage may be applied to the common source line CSL.

In a read mode, the read voltage VR is applied to a selected word line WL2, the second word line drive voltage V2 is applied to a first neighboring word line WL3, which is a neighboring word line of the selected word line WL2 and is arranged below the selected word line WL2, the third word line drive voltage V3 is applied to a second neighboring word line WL1, which is a neighboring word line of the selected word line WL2 and is arranged above the selected word line WL2, and the first word line drive voltage V1 is applied to non-neighboring word lines WL4 to WL16, which are not neighboring word lines of the selected word line WL2.

In the read mode, a voltage level of the third word line drive voltage V3 may be determined based on a program status of a memory cell connected to the second neighboring word line WL1. For example, when the memory cell connected to the second neighboring word line WL1 is programmed to have a relatively high threshold voltage level, the voltage level of the third word line drive voltage V3 may be determined to be a relatively large level. Alternatively, the voltage level of the third word line drive voltage V3 may be determined based on a voltage level of a bit line. For example, as a precharge voltage of the bit line increases, the voltage level of the third word line drive voltage V3 may be determined to be a relatively large level.

Therefore, the effects of capacitive coupling between word lines may be reduced in the non-volatile memory device 100.

Figure 2:
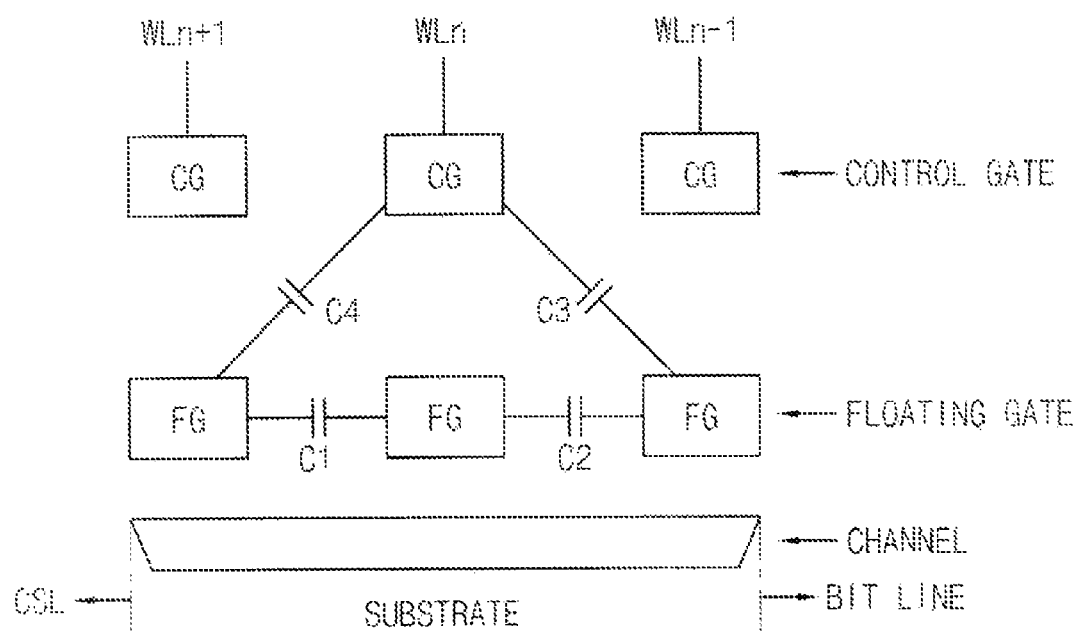
FIG. 2 is a diagram for describing capacitive coupling between a selected word line and neighboring word lines.

FIG. 2 is a diagram for describing capacitive coupling between a selected word line and neighboring word lines. FIG. 2 represents a vertical structure of three memory transistors included in the memory cell array. Control gates CG and floating gates FG of each of a first memory transistor, which is connected to the selected word line WLn, a second memory transistor, which is connected to the first neighboring word line WLn+1 that is a neighboring word line of the selected word line WLn and is arranged below the selected word line WLn, and a third memory transistor, which is connected to the second neighboring word line WLn−1 that is a neighboring word line of the selected word line WLn and is arranged above the selected word line WLn, are disposed on a substrate, and a channel is formed in an upper portion of the substrate during the read operation. The second memory transistor is arranged in a direction of the common source line CSL from the first memory transistor, and the third memory transistor is arranged in a direction of the bit line from the first memory transistor.

Referring to FIG. 2, a capacitive coupling (that is, a parasitic capacitance) C4 may be caused between a control gate of the first memory transistor and a floating gate of the second memory transistor, a capacitive coupling C3 may be caused between the control gate of the first memory transistor and a floating gate of the third memory transistor, a capacitive coupling C1 may be caused between a floating gate of the first memory transistor and the floating gate of the second memory transistor, and a capacitive coupling C2 may be caused between the floating gate of the first memory transistor and the floating gate of the third memory transistor. As design rules shrink, an effect of the capacitive coupling C3 becomes more serious than effects of the capacitive couplings C1, C2 and C4.

Figure 3:
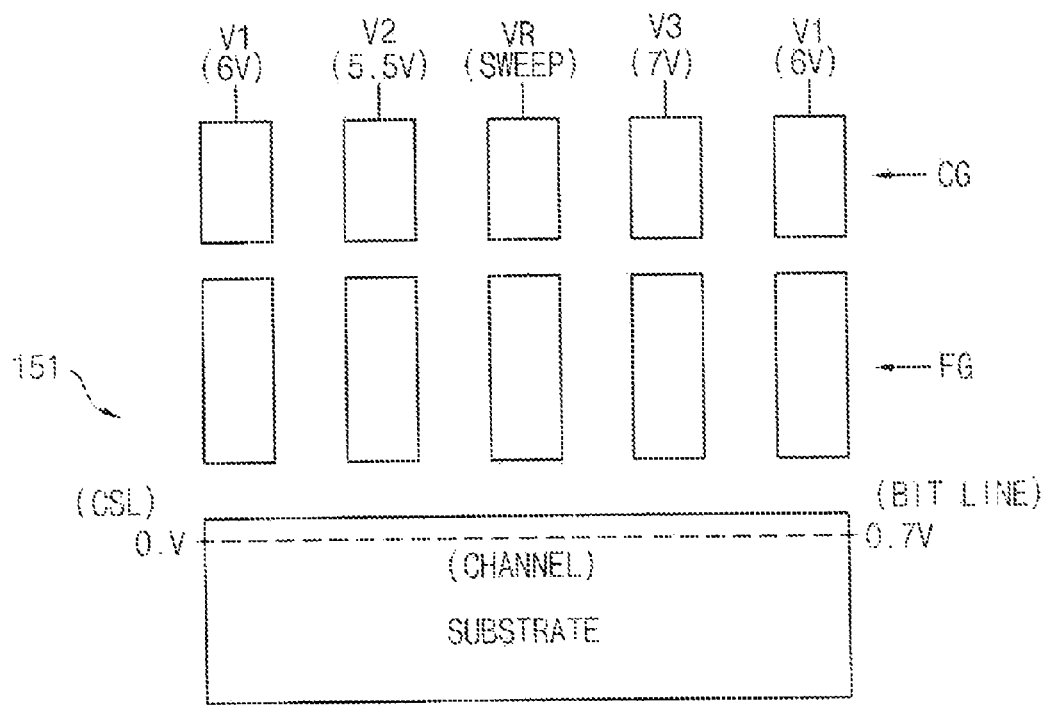
FIG. 3 is a diagram for describing an effect of a capacitive coupling in a conventional method, and an effect of a capacitive coupling in a method of reading data in a non-volatile memory device according to exemplary embodiments of the inventive concept.
Figure 3:
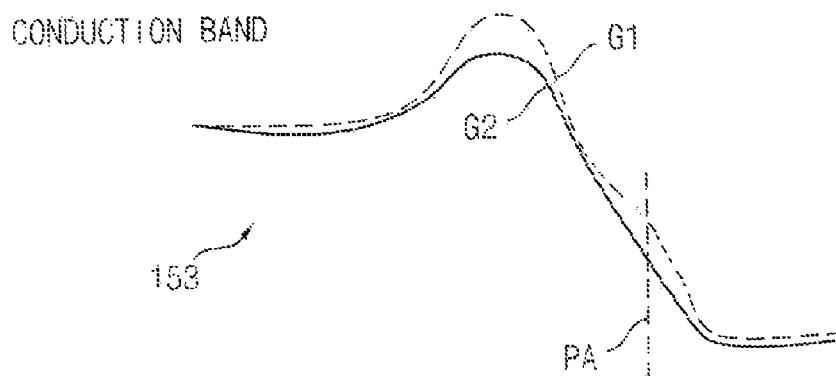

FIG. 3 is a diagram for describing an effect of capacitive coupling in a conventional method and an effect of capacitive coupling in a method of reading data in a non-volatile memory device according to example embodiments of the inventive concept. FIG. 3 represents a vertical structure 151 of five memory transistors included in the memory cell array and voltage graphs 153 of a conduction band in an energy band.

Control gates CG and floating gates FG of each of the first memory transistor receiving the read voltage VR through the selected word line, the second memory transistor receiving the second word line drive voltage V2 through the first neighboring word line that is a neighboring word line of the selected word line and is arranged below the selected word line, the third memory transistor receiving the third word line drive voltage V3 through the second neighboring word line that is a neighboring word line of the selected word line and is arranged above the selected word line, a fourth memory transistor receiving the first word line drive voltage V1 through a word line that is not a neighboring word line of the selected word line and is a neighboring word line of the first neighboring word line, and a fifth memory transistor receiving the first word line drive voltage V1 through a word line that is not a neighboring word line of the selected word line and is a neighboring word line of the second neighboring word line are disposed on the substrate, and a channel is formed in an upper portion of the substrate during the read operation. The fourth memory transistor is arranged in a direction of the common source line CSL from the first memory transistor, and the fifth memory transistor is arranged in a direction of the bit line from the first memory transistor.

In example embodiments of FIG. 3, the first word line drive voltage V1 is 6V, the second word line drive voltage V2 is 5.5V, the third word line drive voltage V3 is 7V, and the read voltage VR is −1V.

A voltage graph G1 represents the conduction band in the energy band of a NAND-type flash memory device adopting a conventional read scheme, and a voltage graph G2 represents the conduction band in the energy band of a NAND-type flash memory device according to example embodiments of the inventive concept.

Comparing voltage levels of the graph G1 and the graph G2 at a point PA at which the third memory transistor, which receives the third word line drive voltage V3, is arranged, a voltage level of the graph G2 is lower than a voltage level of the graph G1 because, in the read mode of the conventional read scheme, a voltage of the same level is applied to both word lines, which are neighboring word lines of the selected word line, and word lines, which are not neighboring word line of the selected word line. For example, voltage levels of the second word line drive voltage V2 and the third word line drive voltage V3 are the same as a voltage level of the first word line drive voltage V1 in the read mode according to the conventional read scheme.

Therefore, effects of capacitive coupling between word lines may be reduced and a threshold voltage distribution of the memory transistors may be made uniform in a NAND-type flash memory device according to example embodiments of the inventive concept. As a result, data stored in the memory cell array of a NAND-type flash memory device according to example embodiments of the inventive concept may be read correctly and stably.

Figure 4:
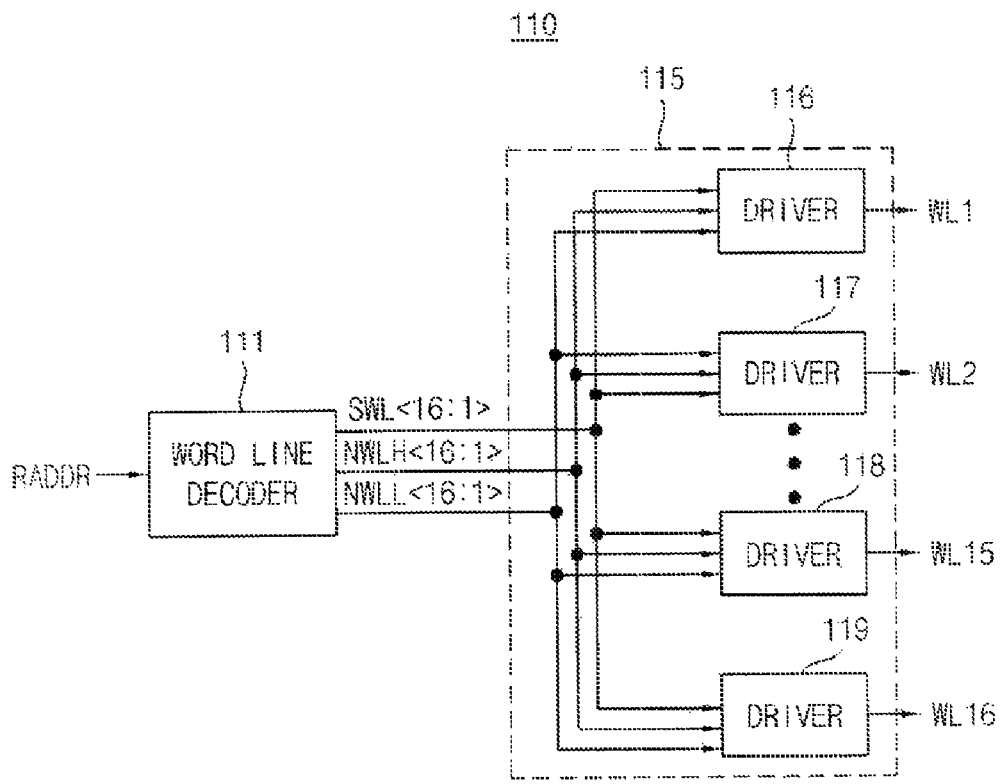
FIG. 4 is a block diagram illustrating an example of a row decoder included in a non-volatile memory device of FIG. 1.

FIG. 4 is a block diagram illustrating an example of a row decoder included in a non-volatile memory device of FIG. 1. Referring to FIG. 4, the row decoder 110 may include a word line decoder 111 and a word line driving unit 115.

The word line decoder 111 may decode a row address RADDR to generate a selected word line control signal SWL, a first non-selected word line control signal NWLH and a second non-selected word line control signal NWLL. In example embodiments of FIG. 4, the selected word line control signal SWL, the first non-selected word line control signal NWLH and the second non-selected word line control signal NWLL include sixteen bits. The bit number of the word line control signals SWL, NWLH and NWLL may be changed depending on the structure of the memory cell array.

The word line driving unit 115 may include drivers 116, 117, . . . 118 and 119 corresponding to word lines WL1 to WL16, respectively. Each of the drivers may generate one of the read voltage VR, the first word line drive voltage V1, the second word line drive voltage V2 and the third word line drive voltage V3 based on the selected word line control signal SWL, the first non-selected word line control signal NWLH and the second non-selected word line control signal NWLL, and provide a respective word line among the word lines WL1 to WL16 with one of the voltages VR, V1, V2 and V3 as a word line drive signal.

Figure 5:
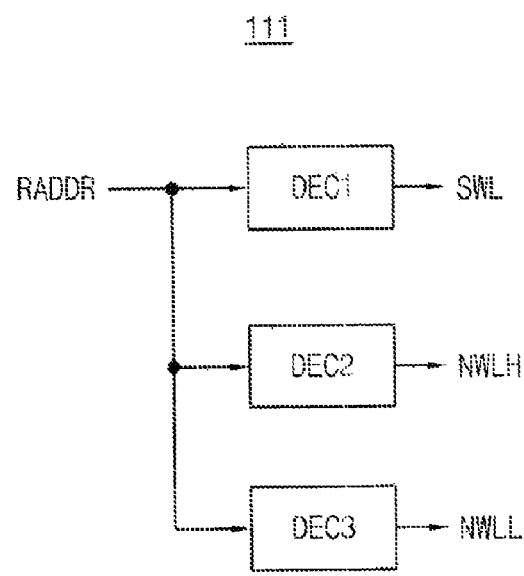
FIG. 5 is a block diagram illustrating an example of a word line decoder included in a row decoder of FIG. 4.

FIG. 5 is a block diagram illustrating an example of a word line decoder included in a row decoder of FIG. 4. Referring to FIG. 5, the word line decoder 111 may include a first decoder DEC1, a second decoder DEC2, and a third decoder DEC3.

The first decoder DEC1 may generate the selected word line control signal SWL by decoding the row address RADDR. The second decoder DEC2 may generate the first non-selected word line control signal NWLH by decoding the row address RADDR. The third decoder DEC3 may generate the second non-selected word line control signal NWLL by decoding the row address RADDR.

Figures 6, 7:
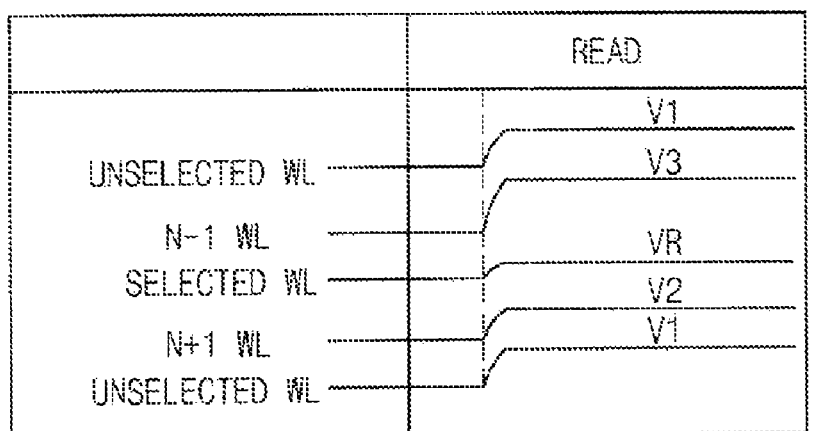
FIG. 6 is a table illustrating voltage levels of word line drive signals, which are generated from a row decoder of FIG. 4, according to a combination of word line control signals.
FIG. 7 is a graph illustrating voltage levels of word line drive signals generated by a row decoder of FIG. 4.

FIG. 6 is a table illustrating voltage levels of word line drive signals, which are generated from a row decoder of FIG. 4, according to a combination of word line control signals. Referring to FIG. 6, when the selected word line control signal SWL is at a logic high level, the first non-selected word line control signal NWLH is at a logic low level, and the second non-selected word line control signal NWLL is at the logic low level, the drivers included in the word line driving unit 115 may provide the read voltage VR as the word line drive signal. When the selected word line control signal SWL is at the logic low level, the first non-selected word line control signal NWLH is at the logic low level, and the second non-selected word line control signal NWLL is at the logic low level, the drivers included in the word line driving unit 115 may provide the first word line drive voltage V1 as the word line drive signal. When the selected word line control signal SWL is at the logic low level, the first non-selected word line control signal NWLH is at the logic low level, and the second non-selected word line control signal NWLL is at the logic high level, the drivers included in the word line driving unit 115 may provide the second word line drive voltage V2 as the word line drive signal. When the selected word line control signal SWL is at the logic low level, the first non-selected word line control signal NWLH is at the logic high level, and the second non-selected word line control signal NWLL is at the logic low level, the drivers included in the word line driving unit 115 may provide the third word line drive voltage V3 as the word line drive signal.

FIG. 7 is a graph illustrating voltage levels of word line drive signals generated by a row decoder of FIG. 4.

As illustrated in FIG. 7, in the read mode, the read voltage VR may be applied to the selected word line SELECTED WL, the second word line drive voltage V2 may be applied to the first neighboring word line N+1 WL, which is a neighboring word line of the selected word line SELECTED WL and is arranged below the selected word line SELECTED WL, the third word line drive voltage V3 may be applied to the second neighboring word line N−1 WL, which is a neighboring word line of the selected word line SELECTED WL and is arranged above the selected word line SELECTED WL, and the first word line drive voltage V1 may be applied to the non-neighboring word lines UNSELECTED WL, which are not neighboring word lines of the selected word line SELECTED WL.

The second word line drive voltage V2 may be equal to or smaller than the first word line drive voltage V1, and the third word line drive voltage V3 may be larger than the first word line drive voltage V1. For example, the first word line drive voltage V1 may be 6V, the second word line drive voltage V2 may be 5.5V, and the third word line drive voltage V3 may be 7V.

Figure 8:
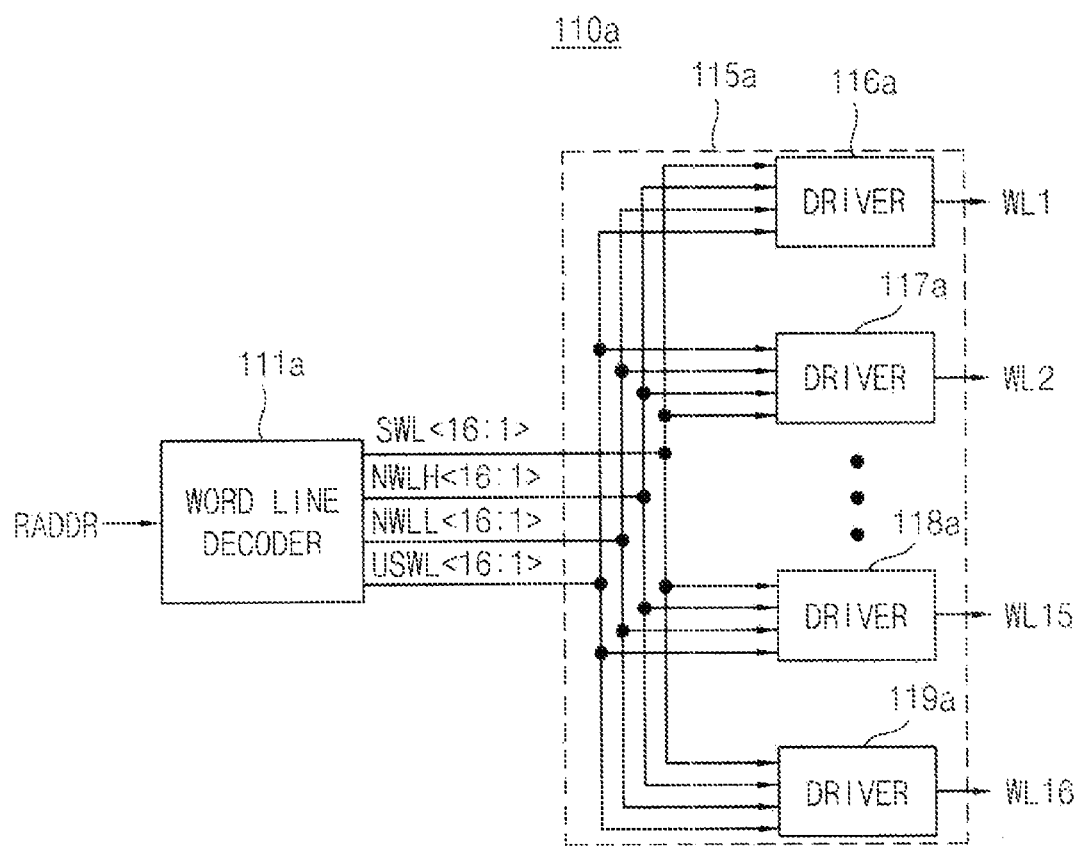
FIG. 8 is a block diagram illustrating an example of a row decoder included in a non-volatile memory device of FIG. 1.

FIG. 8 is a block diagram illustrating another example of a row decoder included in a non-volatile memory of FIG. 1. Referring to FIG. 8, the row decoder 110a may include a word line decoder 111a and a word line driving unit 115a.

The word line decoder 111a may decode the row address RADDR to generate the selected word line control signal SWL, the first non-selected word line control signal NWLH, the second non-selected word line control signal NWLL, and a third non-selected word line control signal USWL. In example embodiments of FIG. 8, the selected word line control signal SWL, the first non-selected word line control signal NWLH, the second non-selected word line control signal NWLL, and the third non-selected word line control signal USWL include sixteen bits. The bit number of the word line control signals SWL, NWLH, NWLL and USWL may be changed depending on the structure of the memory cell array.

The word line driving unit 115a may include drivers 116a, 117a, . . . 118a and 119a corresponding to word lines WL1 to WL16, respectively. Each of the drivers may generate one of the read voltage VR, the first word line drive voltage V1, the second word line drive voltage V2 and the third word line drive voltage V3 based on the selected word line control signal SWL, the first non-selected word line control signal NWLH, the second non-selected word line control signal NWLL, and the third non-selected word line control signal USWL, and provide a respective word line among the word lines WL1 to WL16 with one of the voltages VR, V1, V2 and V3 as the word line drive signal. In a somewhat similar manner as described above with respect to FIGS. 1 and 4, each of drivers 116a, 117a, . . . 118a and 119a receive a set of a selected word line control bit, a first non-selected word line control bit, a second non-selected word line control bit and a third non-selected word line control bit.

Figures 9, 10:
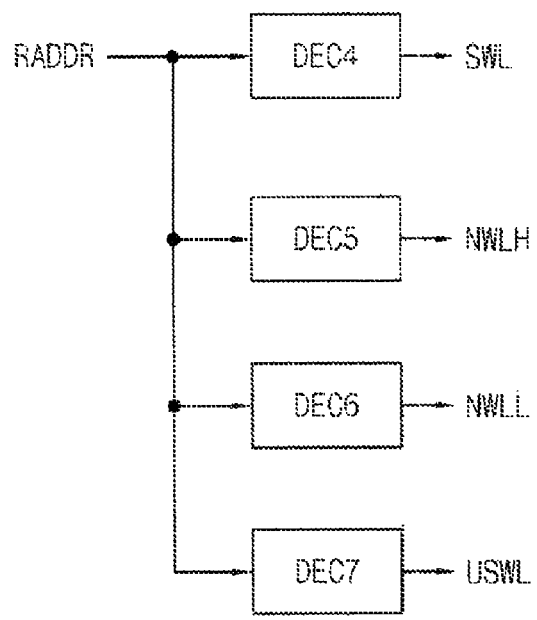
FIG. 9 is a block diagram illustrating an example of a word line decoder included in a row decoder of FIG. 8.
FIG. 10 is a table illustrating voltage levels of word line drive signals, which are generated from a row decoder of FIG. 8, according to a combination of word line control signals.

FIG. 9 is a block diagram illustrating an example of a word line decoder included in a row decoder of FIG. 8. Referring to FIG. 9, the word line decoder 111a may include a fourth decoder DEC4, a fifth decoder DEC5, a sixth decoder DEC6 and a seventh decoder DEC7.

The fourth decoder DEC4 may generate the selected word line control signal SWL by decoding the row address RADDR. The fifth decoder DEC5 may generate the first non-selected word line control signal NWLH by decoding the row address RADDR. The sixth decoder DEC6 may generate the second non-selected word line control signal NWLL by decoding the row address RADDR. The seventh decoder DEC7 may generate the third non-selected word line control signal USWL by decoding the row address RADDR.

FIG. 10 is a table illustrating voltage levels of word line drive signals, which are generated from a row decoder of FIG. 8, according to a combination of word line control signals.

Referring to FIG. 10, when the selected word line control signal SWL is at a logic high level, the first non-selected word line control signal NWLH is at a logic low level, the second non-selected word line control signal NWLL is at the logic low level, and the third non-selected word line control signal USWL is at the logic low level, the drivers included in the word line driving unit 115a may provide the read voltage VR as the word line drive signal. When the selected word line control signal SWL is at the logic low level, the first non-selected word line control signal NWLH is at the logic low level, the second non-selected word line control signal NWLL is at the logic low level, and the third non-selected word line control signal USWL is at the logic high level, the drivers included in the word line driving unit 115a may provide the first word line drive voltage V1 as the word line drive signal. When the selected word line control signal SWL is at the logic low level, the first non-selected word line control signal NWLH is at the logic low level, the second non-selected word line control signal NWLL is at the logic high level, and the third non-selected word line control signal USWL is at the logic low level, the drivers included in the word line driving unit 115a may provide the second word line drive voltage V2 as the word line drive signal. When the selected word line control signal SWL is at the logic low level, the first non-selected word line control signal NWLH is at the logic high level, the second non-selected word line control signal NWLL is at the logic low level, and the third non-selected word line control signal USWL is at the logic low level, the drivers included in the word line driving unit 115a may provide the third word line drive voltage V3 as the word line drive signal.

As described above, in the read mode, the read voltage VR may be applied to the selected word line SELECTED WL, the second word line drive voltage V2, which is equal to or smaller than the first word line drive voltage V1, may be applied to the first neighboring word line N+1 WL, which is a neighboring word line of the selected word line SELECTED WL and is arranged below the selected word line SELECTED WL, the third word line drive voltage V3, which is larger than the first word line drive voltage V1, may be applied to the second neighboring word line N−1 WL, which is a neighboring word line of the selected word line SELECTED WL and is arranged above the selected word line SELECTED WL, and the first word line drive voltage V1 may be applied to the non-neighboring word lines UNSELECTED WL, which are not neighboring word lines of the selected word line SELECTED WL.

In the read mode, a voltage level of the third word line drive voltage V3 may be determined based on a program status of a memory cell connected to the second neighboring word line. For example, when the memory cell connected to the second neighboring word line is programmed to have a relatively high threshold voltage level, the voltage level of the third word line drive voltage V3 may be determined to be a relatively large level. Alternatively, the voltage level of the third word line drive voltage V3 may be determined based on a voltage level of a bit line. For example, as a precharge voltage of the bit line increases, the voltage level of the third word line drive voltage V3 may be determined to be a relatively large level.

Therefore, in a non-volatile memory device according to example embodiments of the inventive concept, the effects of capacitive coupling between word lines may be reduced and a threshold voltage distribution of the memory transistors may be made uniform. As a result, data stored in the memory cell array of a non-volatile memory device according to example embodiments may be read correctly and stably.

Example embodiments of the inventive concept may be used in a non-volatile memory device, particularly in a flash memory device. Although a NAND-type flash memory device is described above, the inventive concept may be applied to other non-volatile memory devices, such as a phase-change random access memory (PRAM), a magnetoresistive random access memory (MRAM), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A non-volatile memory device comprising:
   a row decoder configured to generate, in a read mode, a read voltage, a first word line drive voltage, a second word line drive voltage that is equal to or smaller than the first word line drive voltage, and a third word line drive voltage that is larger than the first word line drive voltage; and
   a memory cell array including a selected word line that receives the read voltage in the read mode, a first neighboring word line of the selected word line that receives the second word line drive voltage in the read mode, a second neighboring word line of the selected word line that receives the third word line drive voltage in the read mode, and a non-neighboring word line of the selected word line that receives the first word line drive voltage in the read mode.

2. The non-volatile memory device of claim 1, wherein the row decoder determines a voltage level of the third word line drive voltage based on a program status of a memory cell connected to the second neighboring word line.

3. The non-volatile memory device of claim 1, wherein the row decoder determines a voltage level of the third word line drive voltage based on a voltage level of a bit line.

4. The non-volatile memory device of claim 1, wherein the selected word line, the first and second neighboring word lines, and the non-neighboring word line are arranged between a string selection line and a common source line.

5. The non-volatile memory device of claim 4, wherein the first neighboring word line is arranged on a side of the common source line relative to the selected word line, and the second neighboring word lines is arranged on a side of the string selection line relative to the selected word line.

6. The non-volatile memory device of claim 1, wherein memory cell array further comprises a plurality of memory cell transistors including control gates respectively connected to the selected word line, the first and second neighboring word lines, and the non-neighboring word line.

7. The non-volatile memory device of claim 1, wherein the row decoder comprises:
   a word line decoder configured to generate a selected word line control signal, a first non-selected word line control signal and a second non-selected word line control signal by decoding a row address; and
   a word line driving unit configured to generate the read voltage, the first word line drive voltage, the second word line drive voltage and the third word line drive voltage based on the selected word line control signal, the first non-selected word line control signal and the second non-selected word line control signal.

8. The non-volatile memory device of claim 7, wherein the word line decoder comprises:

a first decoder configured to generate the selected word line control signal by decoding the row address;
   a second decoder configured to generate the first non-selected word line control signal by decoding the row address; and
   a third decoder configured to generate the second non-selected word line control signal by decoding the row address.

9. The non-volatile memory device of claim 7, wherein the word line driving unit includes a plurality of drivers, and wherein each of the drivers is configured to generate
   the read voltage when the selected word line control signal is at a logic high level, the first non-selected word line control signal is at a logic low level, and the second non-selected word line control signal is at the logic low level,
   the first word line drive voltage when the selected word line control signal is at the logic low level, the first non-selected word line control signal is at the logic low level, and the second non-selected word line control signal is at the logic low level,
   the second word line drive voltage when the selected word line control signal is at the logic low level, the first non-selected word line control signal is at the logic low level, and the second non-selected word line control signal is at the logic high level, and
   the third word line drive voltage when the selected word line control signal is at the logic low level, the first non-selected word line control signal is at the logic high level, and the second non-selected word line control signal is at the logic low level.

10. The non-volatile memory device of claim 1, wherein the row decoder includes:
    a word line decoder configured to generate a selected word line control signal, a first non-selected word line control signal, a second non-selected word line control signal, and a third non-selected word line control signal by decoding a row address; and
    a word line driving unit configured to generate the read voltage, the first word line drive voltage, the second word line drive voltage and the third word line drive voltage based on the selected word line control signal, the first non-selected word line control signal, the second non-selected word line control signal, and the third non-selected word line control signal.

11. The non-volatile memory device of claim 10, wherein the word line decoder includes:
    a first decoder configured to generate the selected word line control signal by decoding the row address;
    a second decoder configured to generate the first non-selected word line control signal by decoding the row address;
    a third decoder configured to generate the second non-selected word line control signal by decoding the row address; and
    a fourth decoder configured to generate the third non-selected word line control signal by decoding the row address.

12. The non-volatile memory device of claim 10, wherein the word line driving unit includes a plurality of drivers, and wherein each of the drivers is configured to generate
    the read voltage when the selected word line control signal is at a logic high level, the first non-selected word line control signal is at a logic low level, the second non-selected word line control signal is at the logic low level, and the third non-selected word line control signal is at the logic low level, the first word line drive voltage when the selected word line control signal is at the logic low level, the first non-selected word line control signal is at the logic low level, the second non-selected word line control signal is at the logic low level, and the third non-selected word line control signal is at the logic high level, the second word line drive voltage when the selected word line control signal is at the logic low level, the first non-selected word line control signal is at the logic low level, the second non-selected word line control signal is at the logic high level, and the third non-selected word line control signal is at the logic low level, and the third word line drive voltage when the selected word line control signal is at the logic low level, the first non-selected word line control signal is at the logic high level, the second non-selected word line control signal is at the logic low level, and the third non-selected word line control signal is at the logic low level.

13. A method of reading a non-volatile memory device, comprising:

generating, in a read mode, a read voltage, a first word line drive voltage, a second word line drive voltage that is equal to or smaller than the first word line drive voltage, and a third word line drive voltage that is larger than the first word line drive voltage;

applying the read voltage to a selected word line in the read mode;

applying the second word line drive voltage to a first neighboring word line of the selected word line in the read mode;

applying the third word line drive voltage to a second neighboring word line of the selected word line in the read mode; and applying the first word line drive voltage to a non-neighboring word line of the selected word line in the read mode.

14. The method of claim 13, wherein said generating includes:

determining a voltage level of the third word line drive voltage based on a program status of a memory cell connected to the second neighboring word line.

15. The method of claim 13, wherein said generating includes:

determining a voltage level of the third word line drive voltage based on a voltage level of a bit line.

16. The method of claim 13, wherein the selected word line, the first and second neighboring word lines, and the non-neighboring word line are arranged between a string selection line and a common source line.

17. The method of claim 16, wherein the first neighboring word line is arranged on a side of the common source line relative to the selected word line, and the second neighboring word lines is arranged on a side of the string selection line relative to the selected word line.

18. The method of claim 13, wherein a plurality of memory cell transistors including control gates respectively are connected to the selected word line, the first and second neighboring word lines, and the non-neighboring word line.

* * * * *